(12) United States Patent
Park et al.

(10) Patent No.: US 7,329,846 B2
(45) Date of Patent: Feb. 12, 2008

(54) ELECTRIC RANGE

(75) Inventors: Byeong Wook Park, Gwangmyeong-si (KR); Dong Seong Kwag, Seoul (KR)

(73) Assignee: LG Electronics Inc., Seoul (KR)

( * ) Notice: Subject to any disclaimer, the term of this patent is extended or adjusted under 35 U.S.C. 154(b) by 216 days.

(21) Appl. No.: 11/204,156

(22) Filed: Aug. 16, 2005

(65) Prior Publication Data
US 2006/0191908 A1 Aug. 31, 2006

(30) Foreign Application Priority Data
Feb. 25, 2005 (KR) .................. 10-2005-0015888

(51) Int. Cl.
H05B 6/12 (2006.01)
A47B 77/08 (2006.01)
(52) U.S. Cl. ..................... 219/622; 312/236
(58) Field of Classification Search ............... 219/622, 219/620, 623, 385, 647; 312/236
See application file for complete search history.

(56) References Cited
U.S. PATENT DOCUMENTS

| 5,648,008 A * | 7/1997 | Barritt et al. ............... 219/626 |
| 5,911,897 A * | 6/1999 | Hamilton ..................... 219/497 |
| 6,509,629 B2 * | 1/2003 | Yoshimatsu et al. ........ 257/660 |
| 6,719,559 B2 * | 4/2004 | Cao ............................. 433/29 |
| 6,758,200 B2 * | 7/2004 | Hageman et al. ........... 123/647 |
| 6,824,294 B2 * | 11/2004 | Cao ........................... 362/231 |
| 6,896,494 B2 * | 5/2005 | Sunaga et al. ........... 417/423.1 |
| 6,929,472 B2 * | 8/2005 | Cao ............................ 433/29 |
| 7,012,446 B2 * | 3/2006 | Taguchi et al. ............. 324/772 |

FOREIGN PATENT DOCUMENTS

| JP | 11-274383 | * 11/1999 |
| KR | 10-2001-0018751 | 3/2001 |

* cited by examiner

Primary Examiner—Daniel Robinson
(74) Attorney, Agent, or Firm—Birch, Stewart, Kolasch and Birch, LLP

(57) ABSTRACT

An electric range includes a circuit board provided with at least one semiconductor chip and adapted to control an electric current to be applied to an induction heating device, a heat sink to absorb heat of the semiconductor chip to discharge the heat to the outside, and at least one heat spread clip to fix the semiconductor chip to the heat sink to conduct the heat of the semiconductor chip to the heat sink.

18 Claims, 4 Drawing Sheets

ELECTRIC RANGE

This application claims the benefit of the Korean Patent Application No. P 2005-15888, filed on Feb. 25, 2005, which is hereby incorporated by reference as if fully set forth herein.

BACKGROUND OF THE INVENTION

1. Field of the Invention

The present invention relates to cooking appliances, and more particularly, to electric ranges.

2. Discussion of the Related Art

Generally speaking, electric ranges are appliances for cooking food via heat produced by electric heaters or other electric heating elements.

Such an electric range is mounted at a cook-top of an electric oven range, etc. Recently, devices for heating a cooking container by induction heating have been developed as replacements for burners using flames generated by the burning of fuel gas.

The application field of electric ranges of induction heating type is gradually expanding because the electric ranges are safer than gas ranges using burners. The electric ranges of induction heating type are designed to heat food contained in a metallic container by making use of a magnetic field caused around an induction heating coil by an electric current induced therein.

For the control of the electric current flowing through the induction heating coil, meanwhile, the electric ranges of induction heating type include circuit devices including semiconductors. However, the semiconductors tend to emit a large amount of heat, causing a malfunction of internal circuits so long as they are not effectively cooled.

To solve the above problem, a heat sink is provided in the electric ranges to absorb heat of the semiconductors to thereby discharge the heat to the outside. For this, the semiconductors are firmly affixed to the heat sink.

This solution, however, has a problem in that it is difficult to separate the semiconductors from the heat sink in the case of repair and exchange.

SUMMARY OF THE INVENTION

Accordingly, the present invention is directed to an electric range that substantially obviates one or more problems due to limitations and disadvantages of the related art.

An object of the present invention is to provide an electric range which can effectively emit heat of semiconductor chips provided therein.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electric range comprises a circuit board provided with at least one semiconductor chip and adapted to control an electric current to be applied to an induction heating device, a heat sink to absorb heat of the semiconductor chip to discharge the heat to the outside, and at least one heat spread clip to fix the semiconductor chip to the heat sink to conduct the heat of the semiconductor chip to the heat sink.

The heat spread clip may be provided to cover an upper surface of the semiconductor chip.

The heat spread clip may include a coupling portion having a receiving recess to come into contact with the upper surface of the semiconductor chip, and extensions extending from opposite sides of the coupling portion to come into contact with the heat sink at their lower surfaces.

The extensions may be coupled to the heat sink by fastening screws. An electrical insulating sheet may be provided between each of the extensions and the heat sink. The heat spread clip may be made of aluminum. The receiving recess may be convexly rounded upwards, and the upper surface of the semiconductor chip may be rounded convexly to correspond to the receiving recess.

The electric range may further comprise an electrical insulating sheet provided between the semiconductor chip and the heat sink. The heat spread clip may be coupled to the heat sink by fastening screws. The screws may be fastened to the heat sink by simultaneously penetrating through both the circuit board and the heat spread clip.

In another aspect of the present invention, there is provided an electric range comprising a circuit board provided with at least one semiconductor chip and adapted to control an electric current to be applied to an induction heating device, a heat sink to absorb heat of the semiconductor chip to discharge the heat to the outside, at least one heat spread clip including a coupling portion having a receiving recess to come into contact with an upper surface of the semiconductor chip and extensions extending from opposite sides of the coupling portion to come into contact with the heat sink at their lower surfaces, and an electrical insulating sheet provided between a lower surface of the semiconductor clip and the heat sink.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts, and thus a detailed description thereof will be omitted.

Now, an electric range according to the present invention will be explained with reference to FIGS. 1 to 4.

Figure 1:
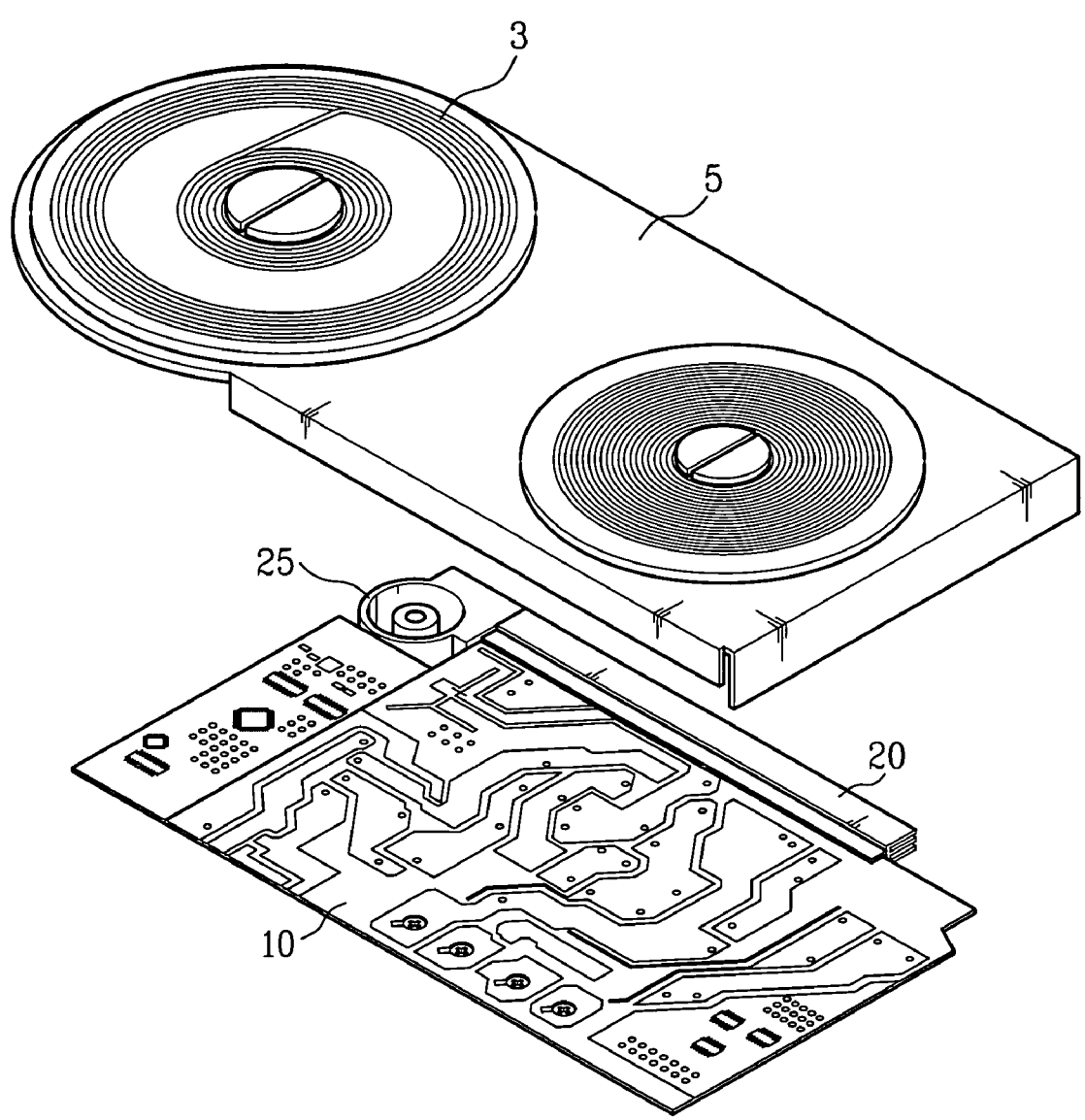
FIG. 1 is an exploded perspective view illustrating an electric range of induction heating type according to the present invention.

FIG. 1 is an exploded perspective view illustrating an electric range of induction heating type according to the present invention.

As shown in FIG. 1, the electric range of induction heating type basically comprises an induction heating coil 3, a circuit board 10, and a heat sink 20.

More specifically, the circuit board 10 includes various devices, such as transistors, resistors, and semiconductor chips, for the control of electric current flowing through the induction heating coil 3. That is, the supply of electric current to the induction heating coil 3 is adjusted via manual manipulation of the circuit board 10.

The induction heating coil 3 is provided at the upper side of the circuit board 10 and is adapted to produce a magnetic field using an electric current flowing therethrough. As known, since a magnetic field depends on the amount of electric current, the strength of the magnetic field is varied by adjusting the amount of electric current supplied to the induction heating coil 10.

At the upper side of the induction heating coil 3 is provided an upper panel (not shown) for loading a metallic container (not shown) that contains food to be cooked. The induction heating coil 3 produces a magnetic field upon receiving the electric current, which is adjusted while passing through the circuit board 10.

The magnetic field is applied to the container through the upper panel to thereby produce an induced current in the metallic container. Since cooking appliances are generally made of metals having high resistance values, the induced current, flowing in the container, generates heat by resistance, thereby heating food received in the container.

To prevent radiant heat from the container heated by the induction heating coil 3 and the magnetic field of the induction heating coil 3 from affecting the circuit board 10, a shield plate 5 is provided between the induction heating coil 3 and the circuit board 10.

A heat sink 20 is provided at the rear side of the circuit board 10 to discharge heat from the circuit board 10 to the outside. That is, the heat, produced in the circuit board 10, is conducted to the heat sink 20 to thereby be discharged to the outside via heat exchange with outside air. For this, it is preferable that the heat sink 20 is made of a highly heat conductive material, and a plurality of fins is provided along one side of the heat sink 20 to increase a heat transfer area with the outside air.

More preferably, a fan 25 for blowing the outside air is provided beside the heat sink 20. Thereby, the heat, conducted to the heat sink 20, is discharged to the outside via heat exchange with the outside air blown by the fan 25.

Among the devices provided at the circuit board 10, especially, semiconductor chips, such as insulated gate bipolar transistors (IGBT) as key devices, tend to emit a large amount of heat and are sensitive to heat. For this reason, the circuit board 10 may cause control malfunction so long as the semiconductor chips are not effectively cooled.

As a solution of the above problem, structures for cooling the semiconductor chips according to embodiments of the present invention will now be explained.

Figure 2:
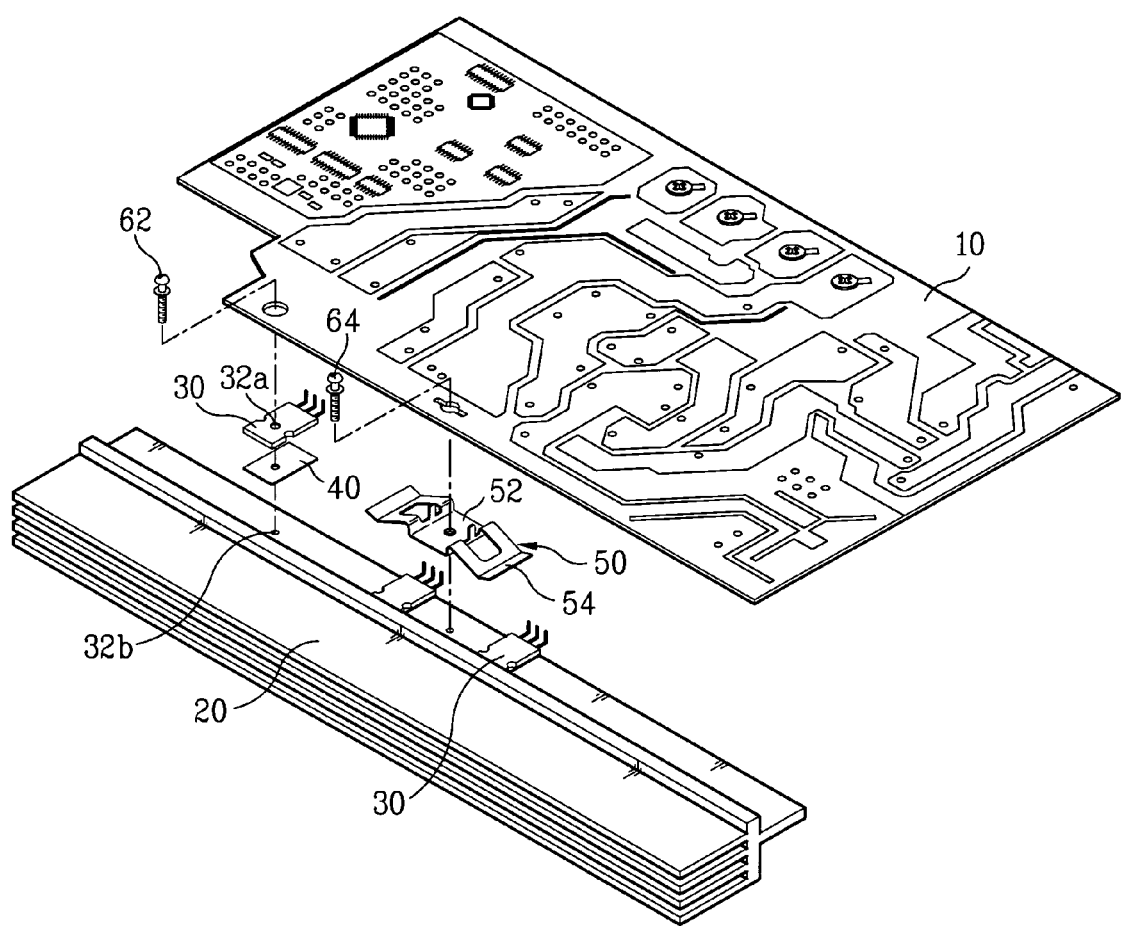
FIG. 2 is an exploded perspective view illustrating a fixing structure for semiconductor chips provided in the electric range according to a first embodiment of the present invention.

FIG. 2 is a perspective view illustrating the important parts of the electric range according to a first embodiment of the present invention.

As shown in FIG. 2, the heat sink 20 is provided at one side of the inverter circuit board 10 provided in the electric range. To the circuit board 10 is connected the semiconductor chips, such as IGBTs, emitting a large amount of heat. The semiconductor chips have a plurality of connecting pins, which are bent at their distal ends into an approximately L-shaped form to be connected to the circuit board 10.

The semiconductor chips are connected to the circuit board 10 in an electrical signal transmission manner through the connecting pins, and simultaneously, are connected to the heat sink 20. To effectively conduct the heat from the semiconductor chips to the heat sink 20, the heat sink 20 must be fixed in contact with the semiconductor chips.

For this, it is preferable that the semiconductor chips 30 are clamped to a surface of the heat sink 20 by means of fixing clips 50.

Two semiconductor chips are provided at opposite sides of each fixing clip 50. The fixing clip 50 has a fixing portion 52, and pressure portions 54 at opposite sides of the fixing portion 52.

The fixing portion 52 has a center screw hole corresponding to a screw hole formed at the heat sink 20. As a screw 64 is fastened through the screw holes, the fixing portion 52 is coupled to come into contact with an upper surface of the heat sink 20. The pressure portions 54, provided at opposite sides of the fixing portion 52, serve to press the semiconductor chips 30 toward the surface of the heat sink 20 via elasticity.

In a word, as the fixing clip 50 is positioned between the semiconductor chips 30 and the screw 64 is fastened to couple the fixing clip 50 to the heat sink 20, the semiconductor chips 30 are fixed into contact with the heat sink 20 by the pressure portions 54.

As a result, heat generated in the semiconductor chips 30 is transferred to the heat sink 20 through contact surfaces therebetween, enabling cooling of the semiconductor chips 30.

Alternatively, the semiconductor chip may be directly coupled to the heat sink by means of the screw 64 without using the fixing clip.

Referring to FIG. 2, the semiconductor chip 30 has a center screw hole 32a corresponding to a screw hole 32b formed at the heat sink 20. As a screw 62 is fastened through the screw holes 32a and 32b, the semiconductor chip 30 is fixed into close contact with the heat sink 20. In this case, it is important to accurately and tightly fasten the screw 62 through the screw holes 32a and 32b because inaccurate screw fastening causes part of the semiconductor chip 30 to come off the heat sink 20, resulting in heat transfer failure.

To prevent a leakage of electric current from the semiconductor chip 30 to the heat sink 20, preferably, an electrical insulating sheet 40 is provided between the semiconductor chip 30 and the heat sink 20.

As the screw 62 is fastened through the screw holes 32a and 32b formed at the semiconductor chip 30 and the heat sink 20, the sheet 40 is compressed and clamped between the semiconductor chip 30 and the heat sink 20.

Meanwhile, the semiconductor chip 30, such as IGBT, etc., may cause a sudden temperature rise in operation because it emits a considerably large amount of heat. The sudden temperature rise hinders sufficient heat transfer from the semiconductor chip 30 to the heat sink 20.

To solve the above problem, a second embodiment of the present invention, which will be described hereinafter, discloses a structure for improving the heat transfer efficiency from the semiconductor chip to the heat sink.

Figure 3:
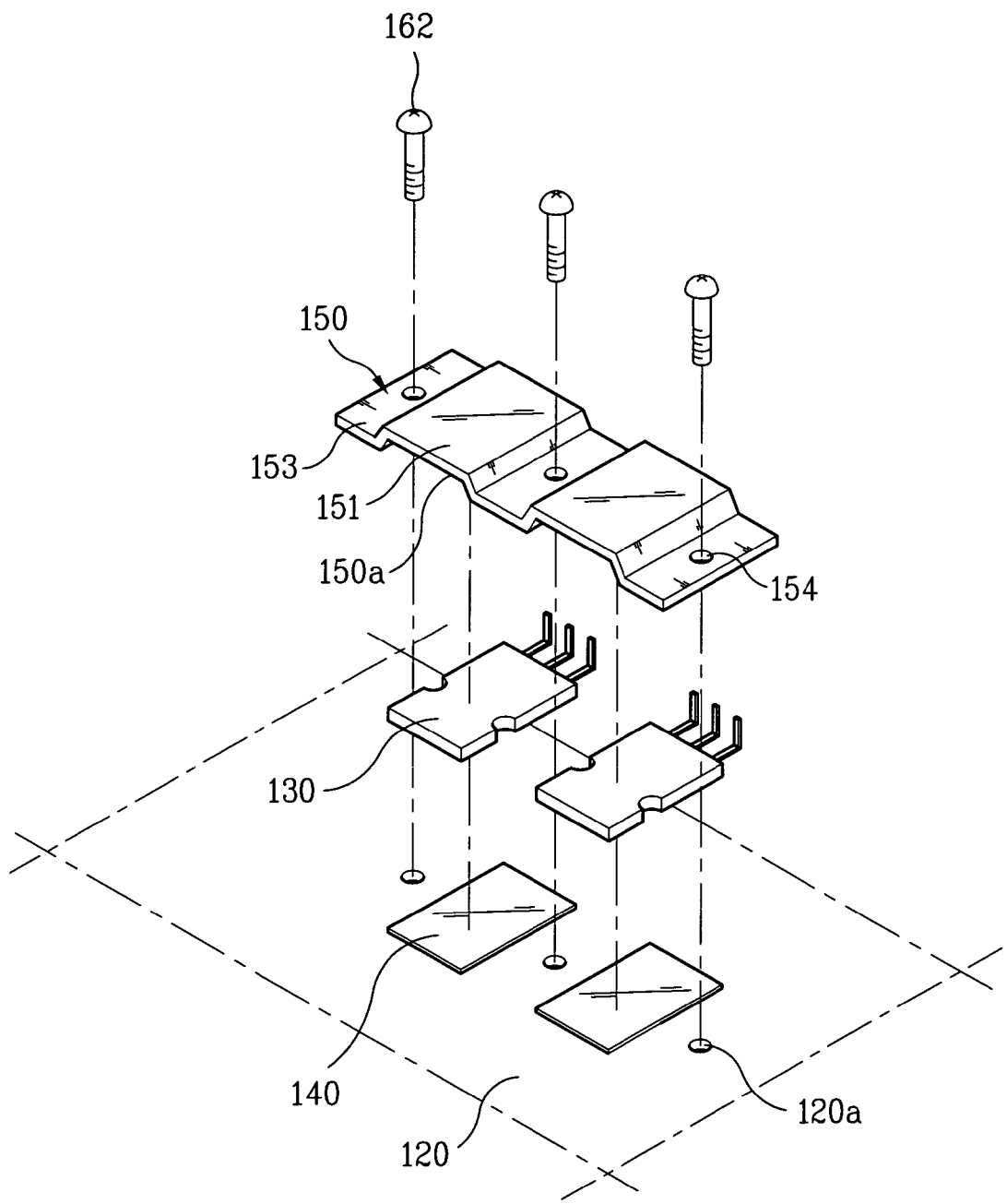
FIG. 3 is an exploded perspective view illustrating a fixing structure for semiconductor chips provided in the electric range according to a second embodiment of the present invention.

FIG. 3 is a perspective view illustrating a heat-emitting structure of the electric range according to a second embodiment of the present invention. Here, the basic configuration of the electric range is identical to the above first embodiment, and thus a detailed description thereof will be omitted.

Referring to FIG. 3, the circuit board (designated as reference number 10 in FIG. 2) is provided in the electric range to control the supply of electric current to a heating device for heating food, etc., by induction heating. Here, the heating device is preferably the induction heating coil as described above. At one side of the circuit board 10 is provided a heat sink 120 to absorb heat produced in the circuit board 10 and the semiconductor chips 130 to discharge the heat to the outside.

The heat sink 120 is configured to come into contact with the circuit board 10 or semiconductor chips 130 for the conduction of heat produced in the semiconductor chips 130. The heat sink 120 is provided along one side thereof with a plurality of protruding fins for increasing a heat transfer area with outside air.

The fan (designated as reference number 25 in FIG. 1) is provided beside the heat sink 120 to blow the outside air toward the heat sink 120. As the blown air circulates between the fins, it performs heat exchange with heat transferred to the heat sink 120, allowing the heat produced in the semiconductor chips 130 to be discharged to the outside.

Among various semiconductor chips mounted at the circuit board 10, especially, in the case of the semiconductor chip 130, such as IGBT, emitting a large amount of heat, it is important to transfer heat to the heat sink 120 via the upper and lower surfaces thereof.

For this, preferably, the semiconductor chip 130 is coupled to the heat sink 120 by means of a heat spread clip 150. The heat spread clip 150 allows the semiconductor chip 130 to come into contact at the lower surface thereof with a surface of the heat sink 120 while achieving a heat transfer path via the upper surface thereof.

Specifically, the heat spread clip 150 is disposed to cover the upper surface of the semiconductor chip 130 and to press the semiconductor chip 130 into contact at the lower surface thereof with the surface of the heat sink 120. The heat spread clip 150 has at least one coupling portion 151 and extensions 153 at opposite sides of the coupling portion 151.

The coupling portion 151 has a receiving recess 150a to come into contact with the upper surface of the semiconductor chip. The extensions 153, extending from opposite sides of the coupling portion 151, are configured to come into contact at their lower surfaces with the heat sink 120.

With such a configuration, the upper surface of the semiconductor chip 130 comes into contact with a lower surface of the coupling portion 151 defining the receiving recess 150a, allowing heat of the semiconductor chip 130 to be successively conducted to the coupling portion 151 and the extensions 153 to thereby be transferred to the heat sink 120.

As will be easily understood from the above description, the heat spread clip 150 is designed to come into contact with the semiconductor chip 130 with a contact area as wide as possible to increase heat conduction efficiency. The heat spread clip 150 is preferably made of aluminum, which is light and has high heat conductivity, but is not limited thereto, and may be made of other highly heat conductive materials.

Preferably, contact portions of the heat spread clip 150 and the heat sink 120 are fastened by means of screws 162. For this, the extensions 153 have screw holes 154 at positions corresponding to screw holes 120a formed at the heat sink 120. As the screws 162 are fastened through the screw holes, the heat spread clip 150 is fixed at a predetermined position, allowing the semiconductor chip 130 to be pressed downward and fixed at a predetermined position.

Here, it is preferable that the screws 162 are fastened into the screw holes 120a of the heat sink 120 by simultaneously penetrating through both the circuit board 10 and the heat spread clip 150. This is effective to stably maintain an electrical signal connection between the semiconductor chips 130 and the circuit board 10.

The receiving recess 150a of the coupling portion 151 is convexly rounded upwards. This means that the upper surface of the semiconductor chip 130 can be rounded convexly. When the extensions 153 are fixed by fastening the screws, thereby, the coupling portion 151 can be elastically deformed to have a rounded contour to thereby come into close contact with the upper surface of the semiconductor chip 130.

Meanwhile, when it is desired to receive a plurality of the semiconductor chips 130 as shown in FIG. 3, the heat spread clip 150 preferably has a plurality of the coupling portions 151 each having the receiving recess 150a to receive the respective semiconductor chips 130. In this case, the coupling portions 151 are connected to each other by means of the extensions 153 provided at opposite sides thereof. Preferably, in addition to the extensions 153 at left and right ends of the heat spread clip 150, the extensions 153 located between the semiconductor chips 130 are fixed into contact with the heat sink 120 by fastening screws.

To prevent the leakage of electric current flowing through the semiconductor chips 130 to the heat sink 120, preferably, an electrical insulating sheet 140 is provided between the semiconductor chip 130 and the heat sink 120. Preferably, the sheet is also provided between the extension 153 and the heat sink 120, and is made of a highly heat conductive material to effectively transfer heat generated in the semiconductor chips.

With the use of the heat spread clip 150 as stated above, the heat, produced in the semiconductor chip 130, is directly conducted to the heat sink 120 that comes into contact with the lower surface of the semiconductor chip 130, and is also indirectly conducted to the heat sink 120 via the heat spread clip 150 in contact with the upper surface of the semiconductor chip 130. In this case, the sheet 140 functions as not only a barrier to prevent the leakage of electric current, but also a heat transfer medium.

As stated above, the semiconductor chip 130 is able to have an increased heat transfer area with the heat sink 120, thereby being effectively cooled.

Figure 4:
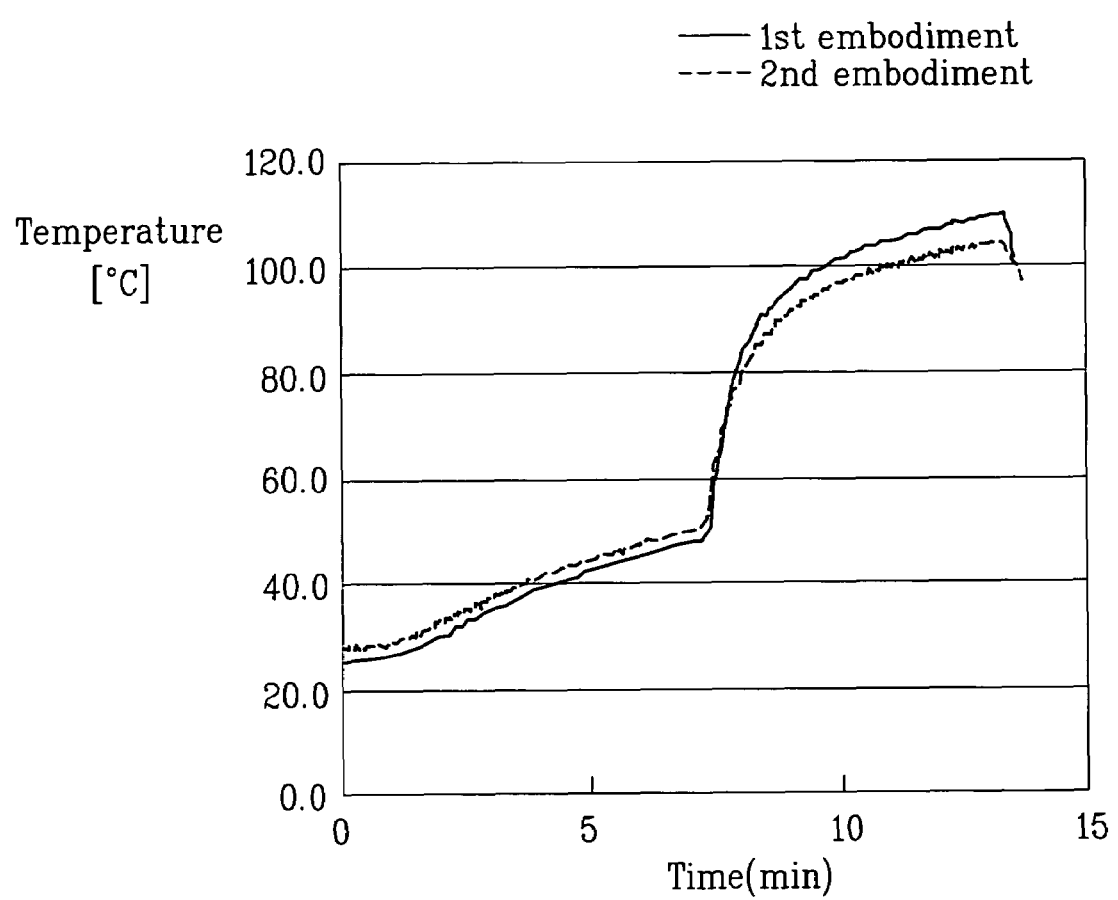
FIG. 4 is a graph illustrating experimental results according to the embodiments of the present invention.

FIG. 4 is a graph illustrating experimental results according to the embodiments of the present invention.

The abscissa of the graph represents an operating time of a semiconductor chip, such as IGBT, and the ordinate of the graph represents a temperature of the semiconductor chip. Meanwhile, the solid line of the graph represents a temperature variation of the semiconductor chip fixed according to the first embodiment of the present invention, and the dotted line represents a temperature variation of the semiconductor chip fixed according to the second embodiment.

As shown in FIG. 4, it is experimentally proven that, when the semiconductor chip is fixed by using the heat spread clip according to the second embodiment, the semiconductor chip shows a low temperature rise and low maximum temperature value in spite of the fact that an initial temperature thereof is higher than that of the first embodiment.

In the second embodiment, the heat of the semiconductor chip 130 is transferred to both the heat sink 120 and the heat spread clip 150 in contact with the lower and upper surfaces of the chip 130, resulting in an improved cooling performance. This enables effective heat emission of the semiconductor chip even if the semiconductor chip shows a sudden temperature rise in operation.

As apparent from the above description, the electric range of the present invention has the following effects.

Firstly, the electric range achieves an improved cooling performance of semiconductor chips through the use of heat spread clips, thereby achieving improved reliability and durability of the semiconductor chips and the electric range.

Secondly, the cooling of semiconductor chips can be achieved by simply providing a space for the coupling of the heat spread clips without changing the structure of a cooling module consisting of a heat sink, fan, and air flow lines. Thus, the present invention is easily applicable to general electric ranges.

Thirdly, since the semiconductor chips are separably fixed by means of the heat spread clips, they can be easily separated in the case of repair or exchange.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An electric range comprising:
    a circuit board provided with at least one semiconductor chip and adapted to control an electric current to be applied to an induction heating device;
    a heat sink to absorb heat of the semiconductor chip to discharge the heat to the outside; and
    at least one heat spread clip to fix the semiconductor chip to the heat sink separably, and to conduct the heat of the semiconductor chip to the heat sink by contacting with the semiconductor chip.

2. The electric range as set forth in claim 1, wherein the heat spread clip is provided to cover an upper surface of the semiconductor chip.

3. An electric range comprising:
    a circuit board provided with at least one semiconductor chip and adapted to control an electric current to be applied to an induction heating device;
    a heat sink to absorb heat of the semiconductor chip to discharge the heat to the outside; and
    at least one heat spread clip to fix the semiconductor chip to the heat sink to conduct the heat of the semiconductor chip to the heat sink,
    wherein the heat spread clip includes:
        a coupling portion having a receiving recess to come into contact with the upper surface of the semiconductor chip; and
        extensions extending from opposite sides of the coupling portion to come into contact with the heat sink at their lower surfaces.

4. The electric range as set forth in claim 3, wherein the extensions are coupled to the heat sink by fastening screws.

5. The electric range as set forth in claim 3, wherein an electrical insulating sheet is provided between each of the extensions and the heat sink.

6. The electric range as set forth in claim 3, wherein the heat spread clip is made of aluminum.

7. The electric range as set forth in claim 3, wherein the receiving recess is convexly rounded upwards, and the upper surface of the semiconductor chip is rounded convexly to correspond to the receiving recess.

8. The electric range as set forth in claim 1, further comprising an electrical insulating sheet provided between the semiconductor chip and the heat sink.

9. The electric range as set forth in claim 1, wherein the heat spread clip is coupled to the heat sink by fastening screws.

10. The electric range as set forth in claim 9, wherein the screws are fastened to the heat sink by simultaneously penetrating through both the circuit board and the heat spread clip.

11. The electric range as set forth in claim 1, further comprising:
    an electrical insulating sheet provided between a lower surface of the semiconductor chip and the heat sink,
    wherein the heat spread clip includes a coupling portion having a receiving recess to come into contact with an upper surface of the semiconductor chip and extensions extending from opposite sides of the coupling portion to come into contact with the heat sink at their lower surfaces.

12. The electric range as set forth in claim 1, wherein the semiconductor chip directly contacts the heat sink.

13. The electric range as set forth in claim 1, wherein the at least one semiconductor chip is in contact with the heat sink and the at least one heat spread clip.

14. The electric range as set forth in claim 13, wherein the at least one semiconductor chip has a first surface and a second surface, the heat sink being in contact with the first surface of the at least one semiconductor chip, the at least one heat spread clip being in contact with the second surface of the at least one semiconductor chip.

15. The electric range as set forth in claim 14, wherein the first surface is opposite to the second surface.

16. The electric range as set forth in claim 14, wherein the at least one heat spread clip covers the entire second surface of the at least one semiconductor chip.

17. The electric range as set forth in claim 14, wherein the at least one heat spread clip presses the second surface of the at least one semiconductor chip by a resilience of the at least one heat spread clip toward the heat sink.

18. The electric range as set forth in claim 1, wherein the at least one semiconductor chip is an insulated gate bipolar transistor (IGBT).

* * * * *